United States Patent [19]

Toyoda et al.

[11] Patent Number: 4,525,812
[45] Date of Patent: Jun. 25, 1985

[54] SEMICONDUCTOR MEMORY DEVICE

[75] Inventors: Kazuhiro Toyoda, Yokohama; Chikai Ono, Kawasaki, both of Japan

[73] Assignee: Fujitsu Limited, Kawasaki, Japan

[21] Appl. No.: 442,755

[22] Filed: Nov. 18, 1982

[30] Foreign Application Priority Data

Nov. 20, 1981 [JP] Japan .................................. 56-185460

[51] Int. Cl.³ ............................................ G11C 11/40
[52] U.S. Cl. ..................................... 365/155; 365/178
[58] Field of Search ......................... 365/155, 179, 178

[56] References Cited

FOREIGN PATENT DOCUMENTS 56-37884  4/1981  Japan .
2117201  10/1983  United Kingdom ................ 365/179

Primary Examiner—James W. Moffitt
Attorney, Agent, or Firm—Staas & Halsey

[57] ABSTRACT

A semiconductor memory device included memory cells each including two PNPN cells cross-coupled with each other, the PNPN cells each including a load transistor and a multi-emitter transistor, the multi-emitter transistor comprising a read/write transistor and a data holding transistor. The read/write transistor has means for decreasing the current amplification factor of the read/write transistor when it operates inversely, whereby the operating speed of the device is improved.

7 Claims, 9 Drawing Figures

1

SEMICONDUCTOR MEMORY DEVICE

BACKGROUND OF THE INVENTION

1. Field of the Invention

The present invention relates to a semiconductor memory device, and more particularly, to a random access memory (RAM) having a bipolar static memory cells with PNPN transistors wherein the operating speed is improved by controlling the current amplification factor of the NPN transistors in each memory cell.

2. Description of the Prior Art

A typical semiconductor memory is comprised of a plurality of word lines, a plurality of bit lines, and a plurality of memory cells located at the intersections of the word lines and bit lines. Semiconductor memories utilize various types of memory cells. The present invention relates to a semiconductor memory utilizing saturation-type memory cells.

Generally, in such a semiconductor memory, that is, a static semiconductor memory, a so-called holding current flows through each memory cell so as to maintain the stored data of logic "1" or "0". When the memory cell is changed from a half selected state to a nonselected state, electric charges stored in the parasitic capacitances of the cell are discharged by the holding current. The greater the holding current, the faster the switching speed from the half selected state to the nonselected state. However, from the view point of large memory capacity and low power consumption, the discharged holding current ($I_H$) should preferably be small. Thus, it is difficult to increase the switching speed by making the holding current large. One previous proposal to get around this problem and achieve a fast switching speed is to have a discharging current ($I_{DS}$) selectively absorbed from a selected word line.

In a semiconductor memory, the emitter voltage of a detection transistor, i.e., a read/write transistor, in each half selected memory cell is usually raised to a high level to prevent adverse influences of a sink current as hereinafter described in detail. However, when the emitter voltage is raised to a high level, the detection transistor operates inversely, as herein described in detail, so that a part of the discharging current ($I_{DS}$) from the word line is unnecessarily branched as a sink current into the bit line connected to the detection transistor of each half selected memory cell. This sink current adversely affects the rising speed of the word line potential. Conventionally, in order to prevent the deterioration of the rising speed of the word line, a bit-line clamping circuit for clamping nonselected bit lines to a level higher than the level of the selected word line is provided. However, in this case, the sink current also flows through each half selected memory cell in the selected word line. The sink current $i_{SNK}$ for each memory cell is expressed as: $i_{SNK} = \gamma(i_H + i_{DS})$, where $\gamma$ is a factor proportional to the current amplification factor $\beta u$ of the detection transistor when it is operated inversely, and $i_H$ and $i_{DS}$ are a holding current and a discharging current for each memory cell, respectively. It is preferable that the sink current $i_{SNK}$ be as small as possible so as to ensure a fast switching operation.

SUMMARY OF THE INVENTION

It is an object of the present invention to provide a semiconductor memory device in which the current amplification factor $\beta u$ of each detecting transistor, when operated inversely, is controlled so that the factor $\gamma$ is made small, whereby the switching speed of each word line when switched from a selected state to a nonselected state is increased without increasing the discharging current.

The above object of the invention is obtained by providing a semiconductor memory device having memory cells and including PNPN cells cross-coupled with each other. Each PNPN cell comprises a load transistor and a multi-emitter transistor. The multi-emitter transistor comprises a read/write transistor and a data holding transistor. The read/write transistor has means for decreasing the current amplification factor of the read/write transistor when it operates inversely, so as to increase the operating speed of the semiconductor memory device.

BRIEF DESCRIPTION OF THE DRAWINGS

The present invention will be more apparent from the following description with reference to the accompanying drawings, wherein.

DESCRIPTION OF THE PREFERRED EMBODIMENTS

Before describing the embodiments of the present invention, conventional techniques and their problems will first be described with reference to FIGS. 1 through 6.

Figure 1:
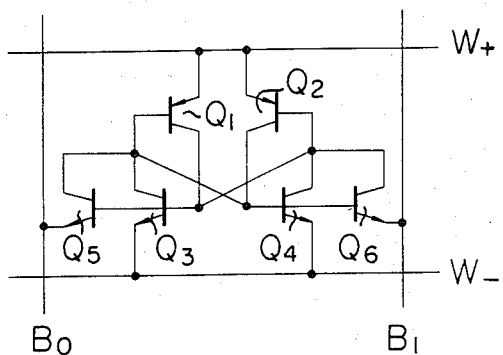
FIG. 1 is an equivalent circuit diagram of a well known bipolar memory cell constructed with PNPN transistors.

FIG. 1 is an equivalent circuit diagram of a well known bipolar memory cell constructed by PNPN transistors. In FIG. 1, a PNP transistor $Q_1$ and an NPN transistor $Q_3$ comprise a first PNPN transistor, and a PNP transistor $Q_2$ and an NPN transistor $Q_4$ comprise a second PNPN transistor. The first PNPN transistor and the second PNPN transistor are cross-coupled with each other. A pair of bit lines $B_0$ and $B_1$ are connected to the emitters of transistors $Q_5$ and $Q_6$, respectively. A word line $W_+$ is connected to the emitters of the PNP transistors $Q_1$ and $Q_2$. Another word line $W_-$ is connected to the emitters of the NPN transistors $Q_3$ and $Q_4$.

To write data into the memory cell, write data is supplied to the bit line $B_0$ or $B_1$ so that either the first or the second PNPN transistor is turned on. To place the transistor $Q_3$ in a conductive state, a current must be passed through the transistor $Q_5$. To place the transistor $Q_4$ in a conductive state, a current must be passed through the transistor $Q_6$. Either the data "1" or "0" is stored in the memory cell, depending or whether the first PNPN transistor or the second PNPN transistor is conductive. The stored data can be detected or read out through the transistor $Q_5$ or $Q_6$ to the bit line $B_0$ or $B_1$. Therefore, the transistors $Q_5$ and $Q_6$ are hereinafter referred to as read/write (R/W) transistors, and the transistors $Q_3$ and $Q_4$ are hereinafter referred to as holding transistors.

Figure 2:
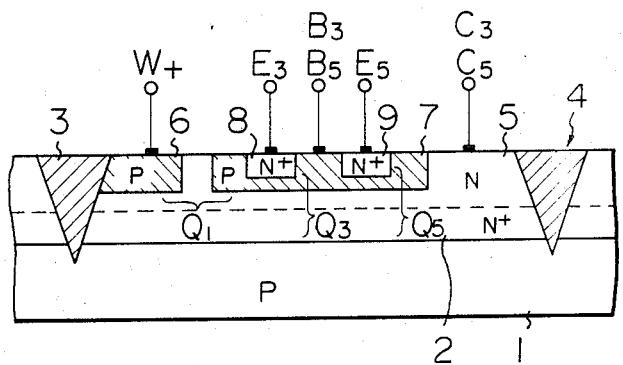
FIG. 2 is a cross-sectional view illustrating the physical structure of a conventional PNPN transistor shown in FIG. 1.

FIG. 2 is a cross-sectional view of the physical structure of the first PNPN transistor shown in FIG. 1. In FIG. 2, on a P-type substrate 1, an N+-type buried layer 2 is formed. Isolation regions 3 and 4 are formed on both sides of the element region of the first PNPN transistor. On the N+-type buried layer 2, an N-type region 5 for collectors of the transistors $Q_3$ and $Q_5$ is formed. At the surface of the N-type region 5 and on the side of the isolation region 3, a P-type region 6 for the emitter of the PNP transistor $Q_1$ is formed. At the surface of the N-type region 5 and on the central portion of the element region, a P-type region 7 for the bases of the transistors $Q_3$ and $Q_5$ and also for the collector of the transistor $Q_1$ is formed. As the surface of the P-type region 7, and N+-type region 8 for the emitter of the transistor $Q_3$ and an N+-type region 9 for the emitter of the transistor $Q_5$ are formed. On the surfaces of the regions 5 through 9, electrodes are formed. The electrode on the region 5 is connected to the collectors $C_3$ and $C_5$ of the transistors $Q_3$ and $Q_5$. The electrode on the region 6 is connected to the word line $W_+$. The electrode on the region 7 is connected to the bases $B_3$ and $B_5$ of the transistors $Q_3$ and $Q_5$. The electrode on the region 8 is connected to the emitter $E_3$ of the transistor $Q_3$. The electrode on the region 9 is connected to the emitter $E_5$ of the transistor $Q_5$. The regions 5, 6, and 7 constitute the lateral PNP transistor $Q_1$. The regions 8, 7, 5, and 2 constitute the vertical NPN transistor $Q_3$. The R/W transistor $Q_5$ is formed by the regions 9, 7, 5, and 2. The transistors $Q_3$ and $Q_5$ have a common base and common collector, but different emitters. Therefore, the transistors $Q_3$ and $Q_5$ are formed as multi-emitter transistor.

The second PNPN transistor has a physical structure similar to the structure of the first PNPN transistor.

As is well known, a PNPN memory cell can hold data when it satisfies the conduction condition:

$$\alpha_{PNP} + \alpha_{NPN} > 1$$

where $\alpha_{PNP}$ is the current amplification factor of the PNP transistor $Q_1$ and $Q_2$ when its base is grounded, and $\alpha_{NPN}$ is the current amplification factor of the NPN transistor $Q_3$ or $Q_4$ when its base is grounded. Under normal manufacturing conditions, $\alpha_{PNP}$ is greater than 0.8 and $\alpha_{NPN}$ is nearly equal to 1. Therefore, the above conduction condition can be satisfied even when the holding current is considerably small. Thus, a PNPN memory cell can hold data by using a holding current which is smaller by one or two orders than that of a coventional static memory cell. Accordingly, a PNPN memory cell is suitable for a low-power RAM and for a large-capacity RAM.

Figure 3:
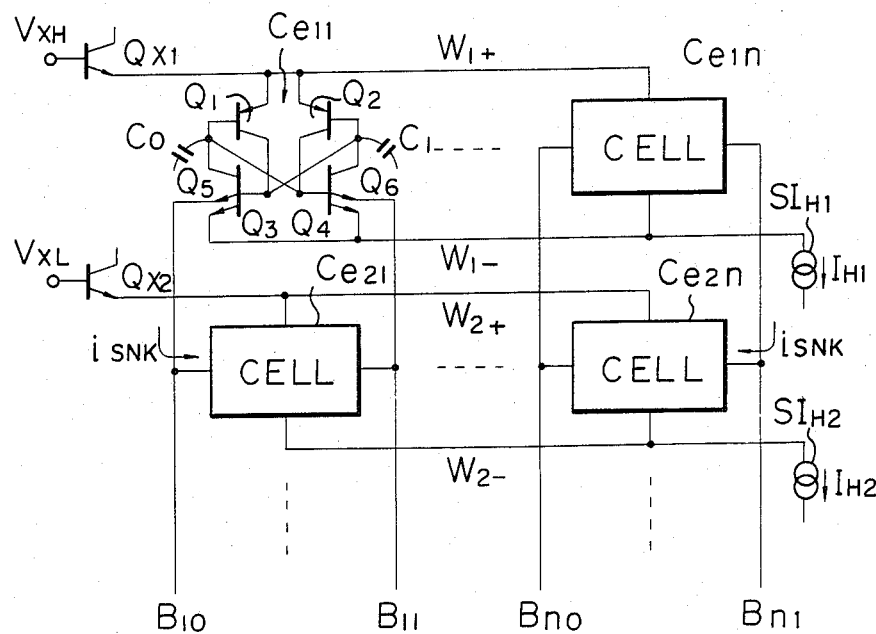
FIG. 3 is a circuit diagram of a main portion of a memory cell array constructed by the PNPN memory cells of FIG. 1.

FIG. 3 is a circuit diagram of a main portion of a memory-cell array constructed by the PNPN memory cells of FIG. 1. In FIG. 3, transistors $Q_{X1}$, $Q_{X2}$, ... are used for driving word lines $W_{1+}$, $W_{2+}$, ..., respectively. To select the word line $W_{1+}$ or $W_{2+}$, a high voltage $V_{XH}$ is applied to the base of the transistor $Q_{X1}$ or $Q_{X2}$. When a low voltage $V_{XL}$ is applied to the base of the transistors $Q_{X1}$ or $Q_{X2}$, the word line $W_{1+}$ or $W_{2+}$ is in a nonselected state. Holding current sources $SI_{H1}$, $SI_{H2}$, ... are connected to the word lines $W_{1-}$, $W_{2-}$, ..., respectively for conducting holding currents $I_{H1}$, $I_{H2}$, ... through the word lines $W_{1-}$, $W_{2-}$, ...

Problems in the memory cell array of FIG. 3 will now be described.

The first problem is as follows. When the word line $W_{1+}$ changes from the selected state to the nonselected state, electric charges, stored in parasitic capacitances in each of the memory cells $C_{ell}$, ... $C_{eln}$ connected to the word line $W_{1+}$, are discharged. The parasitic capacitances are mainly the capacitances $C_0$ and $C_1$ between the collector of the transistors $Q_3$ and $Q_5$ and the substrate, or between the collector of the transistors $Q_4$ and $Q_6$ and the substrate. As mentioned before, since the PNPN memory cell can hold data using a small current, each of the holding currents $I_{H1}$, $I_{H2}$, ... in FIG. 3 is smaller than that of a conventional static memory cell by one or two orders. Therefore, the current for discharging the electric charges stored in the parasitic capacitances is so small that it takes a considerably long time to discharge the electric charges and, accordingly, to change a word line from the selected state to the nonselected state. When the time for changing a word line from a selected state to a nonselected state is too long, a double selected state may be produced. That is, within a certain time period, a word line which is changing from a selected state to a nonselected state and another word line which is changing from a nonselected state to a selected state may have the same electric potential as each other. In this case, the read time is delayed during a reading cycle, and a write error operation may be caused during a writing cycle.

To avoid the aforementioned double selected state without losing the advantage of the low power consumption of the PNPN memory cell, a discharging circuit connected to each word line $W_{1-}$, $W_{2-}$, ... has previously been proposed (see, for example, Japanese patent application No. 54-110720 or Japanese Unexamined patent application (Kokai) No. 56-37884). The discharging circuitt can selectively absorb a discharging current $I_{DS}$ from a word line which is changing from a selected state to a nonselected state. Thus, the electric charges along the selected word lines $W_+$, $W_-$ are discharged together with not only the holding current $I_H$, but also the discharging current $I_{DS}$, that is, in a form of $I_H + I_{DS}$. In a large capacity RAM, the discharging circuit for each word line is especially indispensable.

Figure 4:
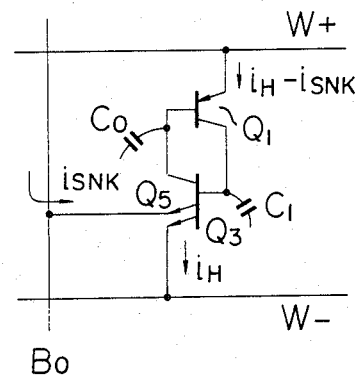
FIG. 4 is a circuit diagram of half of the PNPN memory cell of FIG. 1 used for explaining the problem of a sink current.

The second problem in the circuit of FIG. 3 will be described with reference to FIG. 4. The second problem is caused by an inverse operation of the R/W transistor $Q_5$ or $Q_6$. In FIG. 4, only the first PNPN memory cell is illustrated. When the first PNPN memory cell of FIG. 4 is in a conductive state, both the PNP transistor $Q_1$ and the NPN transistor $Q_3$ are saturated, so that their base-collector junctions are forward biased. That is, the base potential of the multi-emitter transistor $Q_3$ or $Q_5$ is slightly higher than the collector potential. In this state, when the potential of the emitter of the transistor $Q_5$, i.e., the bit line $B_0$ is raised to a level higher than the collector of the transistor $Q_5$, the R/W transistor $Q_5$ is caused to operate in an inverse mode. That is, the emitter of the transistor $Q_5$ acts as a collector and, thereby, a sink current $i_{SNK}$ flows from the bit line $B_0$ through the emitter of the R/W transistor $Q_5$ and the emitter of the transistor $Q_3$, to the word line $W_-$. The source of this sink current $i_{SNK}$ is the holding current source $SI_H$. Therefore, the sink current $i_{SNK}$ can be expressed as:

$$i_{SNK} = \gamma \cdot i_H$$

where $\gamma$ is a constant smaller than 1, representing the ratio between $i_{SNK}$ and $i_H$. Due to the sink current $i_{SNK}$, the emitter current of the transistor $Q_1$ is expressed as $i_H - i_{SNK}$. Therefore, the larger the sink current $i_{SNK}$, the smaller the emitter current of the transistor $Q_1$. The sink current $i_{SNK}$ causes the following adverse influences in the memory cell array. Referring back to FIG. 3, the selected word line, for example the word line $W_{1+}$, has a higher potential than the nonselected word lines. Therefore, the ptential of each bit line is determined by the memory cell connected between the bit line and the selected word line. As a result, the emitters of the R/W transistors $Q_5$ or $Q_6$ in all of the nonselected word lines are reverse biased. Thus, in each nonselected memory cell in all of the nonselected word lines, the sink currently $i_{SNK}$ flows from either one of the pair of bit lines $B_0$ and $B_1$ through the emitter of the R/W transistor $Q_5$ or $Q_6$ to the emitter of the transistor $Q_3$ or $Q_4$ in the conducting PNPN transistor. In FIG. 3, in the nonselected memory cell $C_{e21}$, the first PNPN transistor at the side of the bit line $B_{10}$ is conductive, so that the sink current $i_{SNK}$ flows from the bit line $B_{10}$ into the memory cell $C_{e21}$. Also, in the nonselected memory cell $C_{e2n}$, the second PNPN transistor at the side of the bit line $B_{n1}$ is conductive, so that the sink current $i_{SNK}$ flows from the bit lines $B_{n1}$ into the memory cell $C_{e2n}$. All of the sink currents $i_{SNK}$ flowing into all of the memory cells in all of the nonselected word columns are supplied from the selected word line, for example, the word line $W_{1-}$, through the half selected memory cells. The total sink current $I_{SNK}$ supplied from the selected word line can thus be expressed as:

$$I_{SNK} = \sum_{1}^{N} i_{SNK} = \gamma \sum_{1}^{N} i_H$$

where N is the number of memory cells in the nonselected word columns. The total sink current $I_{SNK}$ causes the potential of the selected word line to be lowered. This is because, since the current supplied to the selected word line (for example, $W_{1+}$) is increased by the total sink current $I_{SNK}$, the transistor (for example $Q_{X1}$) for driving the selected word line must be supplied with a large base current and a large emitter current. Therefore, the potential difference between the base and the emitter of the transistor $Q_{X1}$ is increased, so that the base potential of the transistor $Q_{X1}$ is lowered. On the other hand, with respect to the nonselected word lines, the current supplied to the nonselected word line is decreased by the sink current $i_{SNK}$ as illustrated in FIG. 4. Therefore, the potential of the nonselected word line is increased due to the sink current $i_{SNK}$. As a result, the margin between the potentials of a selected word line and a nonselected word line is narrowed due to the sink current $i_{SNK}$ flowing into each nonselected memory cell.

Further, because of the increase in the current supplied to the selected word line due to the total sink current $I_{SNK}$, the driving ability of the transistor $Q_{x1}$ or $Q_{x2}$, for driving a word line to be selected, is lowered, causing a lowered switching speed and an increase in reading time of the RAM. The larger the number of the memory cells in a large-capacity RAM, the more serious the above-mentioned adverse influences of the sink current $i_{SNK}$ become.

A countermeasure for the adverse influences of the sink current $i_{SNK}$ has already been proposed. In this countermeasure, a clamp circuit is provided to correspond to each pair of bit lines. The clamp circuit clamps the potentials of all the nonselected bit lines to a level higher than the level determined by the selected word line, so that the sink current $i_{SNK}$ is supplied from the clamp circuit. The selected pair of bit lines is, of course, not clamped so as to allow the detection of a potential difference between them. By this countermeasure, the adverse influences of the sink currents $i_{SNK}$ are caused only by the memory cells in the selected pair of bit lines. Therefore, the adverse influences can be neglected.

Figure 5:
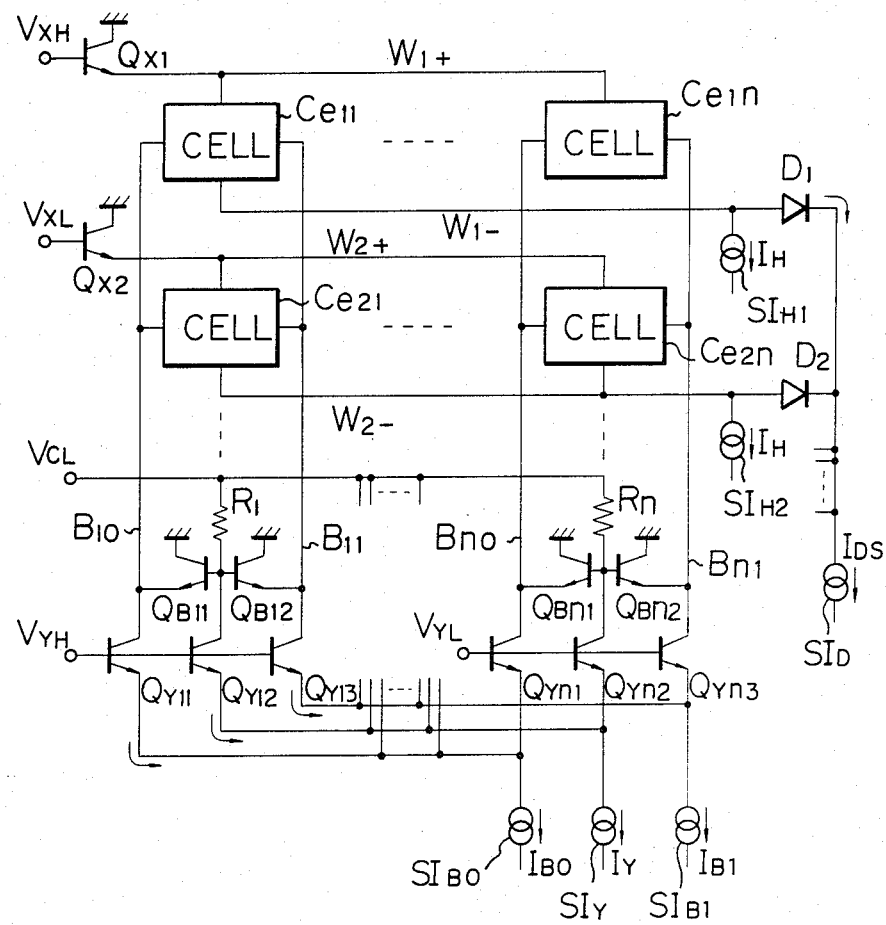
FIG. 5 is a circuit diagram of another conventional memory cell array in which a counter measure, for the problems of discharging current and sink current, is provided.

FIG. 5 is a circuit diagram of a conventional memory cell array in which the countermeasures for the above-mentioned first and second problems, i.e., the problem of the word-line discharging and the problem of the sink current $i_{SNK}$, are provided.

In FIG. 5, diodes $D_1$ and $D_2$ connected to the word line $W_{1-}$ and $W_{2-}$, respectively, supply a discharge current $I_{DS}$ to a selected word line. The cathodes of the diodes $D_1$, $D_2$, . . . are commonly connected to a discharge current source $SI_D$. Transistors $Q_{B11}$, $Q_{B12}$, . . . , $Q_{Bn1}$, and $Q_{Bn2}$ change to nonselected bit lines to a reference potential level $V_{CL}$ higher than the potential of the selected word line. Transistors $Q_{Y11}$, $Q_{Y13}$, . . . , $Q_{Yn1}$ and $Q_{Yn3}$ select the bit lines $B_{10}$, $B_{11}$, . . . , $B_{n0}$ and $B_{n1}$, respectively. Transistors $Q_{Y12}$, . . . and $Q_{Yn2}$ invalidate the clamping transistors $Q_{B11}$, $Q_{B12}$, . . . , $Q_{Bn1}$ and $Q_{Bn2}$ when corresponding bit lines are selected. When a high voltage $V_{YH}$ is applied to, for example, the bases of the transistors $Q_{Y11}$, $Q_{Y12}$ and $Q_{Y13}$, and a low voltage $V_{YL}$ is applied to the bases of the rest of the transistors $Q_{Yi1}$, $Q_{Yi2}$ and $Q_{Yi3}$, where $i = 2, 3, \ldots$, and n, the bit lines $B_{10}$ and $B_{11}$ are selected so that currents $I_{B0}$ and $I_{B1}$ are supplied from current sources $SI_{B0}$ and $SI_{B1}$ to the bit lines $B_{10}$ and $B_{11}$, respectively. Simultaneously, the transistor $Q_{Y12}$ is turned on so that the base potential of the clamping transistors $Q_{B11}$ and $Q_{B12}$ is lowered by a voltage drop across the resistor $R_1$. Thus, the clamping transistors $Q_{B11}$ and $Q_{B12}$ are turned off. The transistors $Q_{Yi1}$, $Q_{Yi2}$ and $Q_{Yi3}$ are kept in their off state. Therefore, the clamping transistors $Q_{Bi1}$ and $Q_{Bi2}$ are kept in their on state, so that the nonselected bit lines $B_{i0}$ and $B_{i1}$ are clamped to a potential higher than the reference voltage $V_{CL}$, which is higher than the potential of the selected word line. The potentials of the selected bit lines $B_{10}$ and $B_{11}$ are, of course, determined by the selected memory cell.

Figure 6:
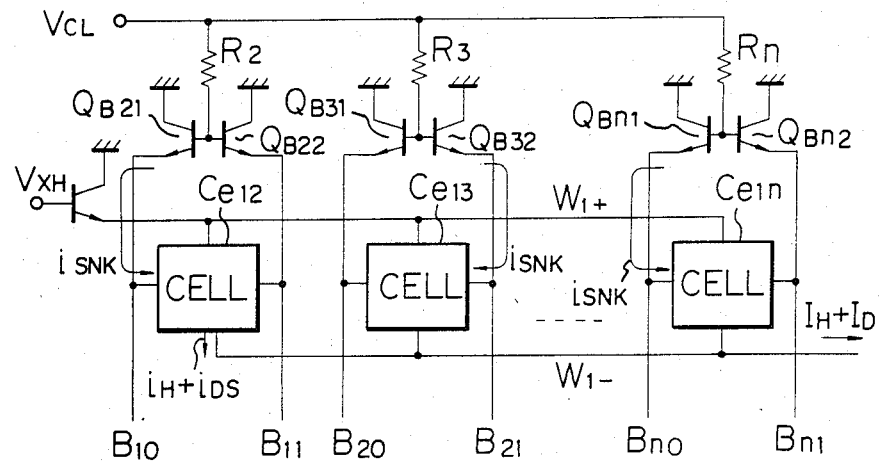
FIG. 6 is a circuit diagram of a portion of the memory cell array in a selected word column other than the selected memory cell.

The conventional device in FIG. 5 still involves the following problem, as explained with reference to FIG. 6. FIG. 6 is part of the memory cell array of FIG. 5, in which the memory cells $C_{e12}$, $C_{e13}$, . . . and $C_{e1n}$, in the selected word column, are shown, but the selected memory cell $C_{e11}$, is not shown. As mentioned before with reference to FIG. 5, all of the nonselected bit lines are clamped to a level higher than the reference voltage $V_{CL}$. Therefore, the R/W transistor in each of the half selected memory cells $C_{e12}$, $C_{e13}$, . . . and $C_{e1n}$ also operate inversely, as the R/W transistors in the nonselected word columns do. Accordingly, a sink current $i_{SNK}$ flows from $V_{CL}$ through, for example, the clamping transistor $Q_{21}$ and the conducting side in the memory cell $C_{e12}$, to the word line $W_{1-}$. In the other half section memory cells, the sink currents also flow through their conducting sides.

When the word column of FIG. 6 changes from the selected state to the nonselected state, the word-line discharging current $I_{DS}$ is selectively supplied to the word line $W_{1-}$. Assume that the holding current flowing through one memory cell is $i_H$ and that the word-line discharging current flowing through one memory cell is $i_{DS}$. Then, the sink current $i_{SNK}$ is expressed as:

$$i_{SNK} = \gamma(i_H + i_{DS})$$

Where $\gamma$ is a constant smaller than 1, representing the ratio between $i_{SNK}$ and $(i_H + i_{DS})$. During the change, electric charges stored in the parasitic capacitances have to be discharged, as mentioned before. The discharge is effected by the collector current and the base current of the NPN transistor $Q_1$ (FIG. 4), as will be seen from FIG. 4. Due to the presence of the sink current $i_{SNK}$, however, the collector current and the base current of the NPN transistor $Q_1$ are decreased. In other words, the discharge current $i_{DS}$ flowing through the word line $W_{1-}$ includes an invalid component. That is, efficiency of the discharge current $I_{DS}$ supplied to the word line $W_{1-}$ can be expressed as $(1-65)$.

In the present invention, by controlling the current amplification factor of the R/W transistor, the constant $\gamma$ is made small so that the efficiency of the discharge current is increased and the switching speed of the word line from the selected state to the nonselected state is increased without increasing the discharge current.

Embodiments of the present invention will now be described with reference to FIGS. 7 through 9.

As described before, the constant $\gamma$ determines the ratio of the sink current $i_{SNK}$ with respect to the supplied current $(i_H + i_{DS})$ to one memory cell. Since the sink current $i_{SNK}$ flows as a result of the inverse operation mode of the R/W transistor, it will easily be seen that the constant $\gamma$ is proportional to the current amplification factor $\beta u$ of the R/W transistor when it is inversely operated. Therefore, the constant $\gamma$ can be made small by decreasing the current amplification factor $\beta u$.

Figure 7:
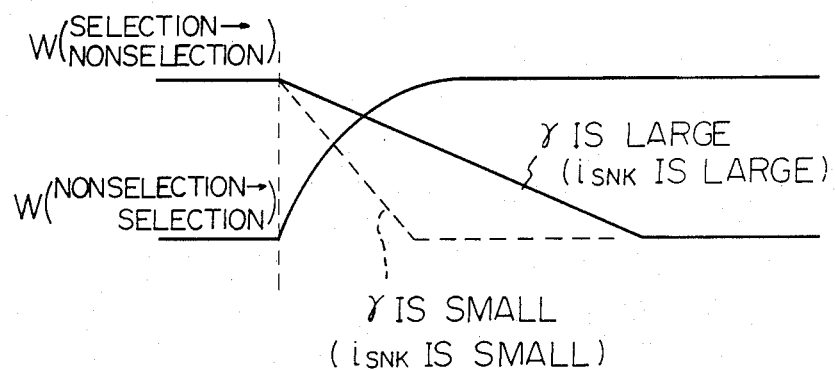
FIG. 7 is a graph of the transition of a word line from a selected state to a nonselected state, according to the present invention.

FIG. 7 is a graph explaining the switching operation of the word line. As will be apparent from FIG. 7, the smaller the constant $\gamma$, the faster the switching speed of the word line from the selected state to the nonselected state.

Figure 8:
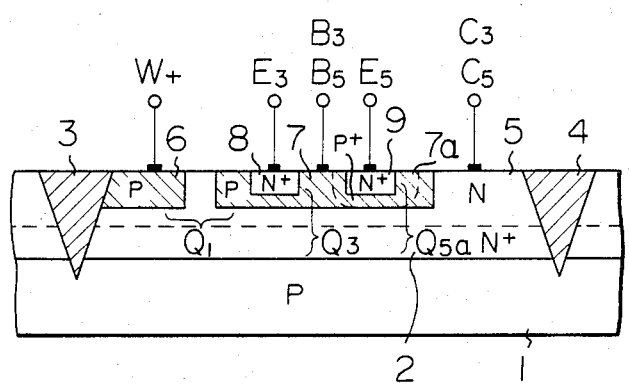
FIG. 8 is a cross-sectional view of a half cell of a semiconductor memory device according to an embodiment of the present invention.

FIG. 8 is a cross-sectional view of the physical structure of a half memory cell. In FIGS. 2 and 8, the same portions are denoted by the same reference numerals or characters. The differences in FIGS. 2 and 8 are that, instead of the R/W transistor $Q_5$ in FIG. 2, a R/W transistor $Q_{5a}$ is provided in FIG. 8. The R/W transistor $Q_{5a}$ has, instead of the P-type for the base of the R/W transistor $Q_5$ in FIG. 2, a $P^+$-type region $7a$ for the base of the R/W transistor $Q_{5a}$. That is, on the periphery of the $N^+$-type region 9 for the emitter $E_5$ of the R/W transistor $Q_{5a}$, the concentration of P-type impurities is higher than the P-type region 7 or 6. The high concentration of the $P^+$-type region $7a$ can easily be formed by, for example, the ion-implantation technique. When the transistor $Q_{5a}$ is in a saturation state, the base-collector junction is forward biased so that electrons are injected from the N-type region 5 for the collector $C_5$ into the $P^+$-type region $7a$ for the base $B_5$. The current amplification factor $\beta u$ of the R/W transistor, when it is inversely operated, is determined by the amount of electrons which reach the $N^+$-type region 9 for the emitter $E_5$ from the $P^+$-type region $7a$. Since the concentration of the P-type impurities in the $P^+$-type region $7a$ is increased, the amount of electrons injected into the $P^+$-type region $7a$ is decreased and also the amount of electrons recombined with the P-type impurities within the $P^+$-type region $7a$ is increased. Therefore, the amount of electrons which reach the $N^+$-type region 9 for the emitter $E_5$, is decreased. Thus, the current amplification factor $\beta u$ of the R/W transistor $Q_{5a}$, when it is inversely operated is decreased.

Figure 9:
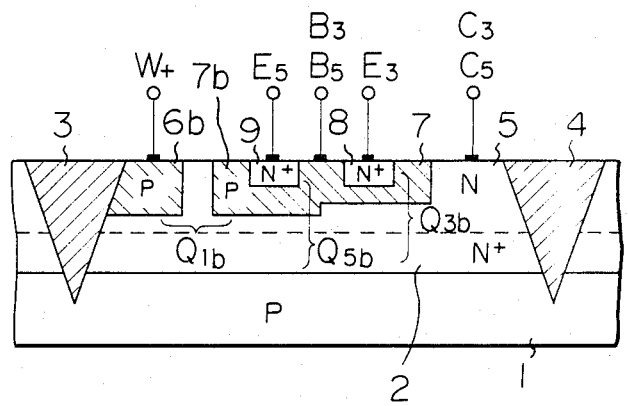
FIG. 9 is a cross-sectional view of a half cell of a semiconductor memory device according to another embodiment of the present invention.

FIG. 9 is a cross-sectional view of another embodiment of the present invention. The difference between FIG. 8 and FIG. 9 is that, instead of forming the NPN transistor $Q_3$ between the PNP transistor $Q_1$ and the R/W transistor $Q_{5a}$ in FIG. 8, a R/W transistor $Q_{5b}$ is formed between a PNP transistor $Q_{1b}$ and an NPN transistor $Q_{3b}$. The transistors $Q_{5b}$ and $Q_{3b}$ have the common P-type region 7 for their bases $B_3$ and $B_5$. It should be noted from FIG. 9 that the thickness of the P-type region 7 under the $N^+$-type region 9 for the emitter $E_5$ of the R/W transistor $Q_{5b}$, which is referred to as a P-type region $7b$, is greater than the thickness of the P-type region 7 under the $N^+$-type region 8 for the emitter $E_3$ of the PNP transistor $Q_{3b}$. Also, a P-type region $6b$ is provided for the emitter of the PNP transistor $Q_{1b}$. The P-type region $6b$ is made as thick as the P-type region $7b$.

By making the P-type region $7b$ for the base of the R/W transistor $Q_{5b}$ thicker than the P-type region 7 for the base of the NPN transistor $Q_{3b}$, it takes a longer time for the electrons, injected into the P-type region $7b$ for the base of the transistor $Q_{5b}$, to reach the $N^+$-type region 9 for the emitter $E_5$. Therefore, in the P-type region $7b$, the probability of recombination of the injected electrons with the P-type impurities is increased. Thus, the current amplification factor $\beta u$ of the R/W transistor $Q_{5b}$ when it is inversely operated can be made small. Further, since the P-type region $6b$ for the emitter of the lateral PNP transistor $Q_{1b}$ is made as thick as the P-type region $7b$ by the same diffusion process, the areas of the P-type region $6b$ and the P-type region $7b$, opposite to each other, are increased, so that the current amplification factor of the PNP transistor $Q_{1b}$ is improved.

In the embodiment of FIGS. 8 and 9, the structures are employed for the purpose of decreasing the current amplification factor of only the R/W transistor when it is inversely operated. It may be considered that no problem will occur in operation when the structure for decreasing the inverse-current amplification factor is employed not only for the R/W transistor but also for the holding transistor $Q_3$ in FIG. 8 or the holding transistor $Q_{3b}$ in FIG. 9, as long as the aforementioned holding condition:

$$\alpha_{PNP} + \alpha_{NPN} > 1$$

is satisfied. However, when the structure for decreasing the inverse-current amplification factor is adapted to the base portion of the holding transistor $Q_3$ in FIG. 8 or $Q_{3b}$ in FIG. 9, the forward current amplification factor $\alpha_{NPN}$ is also decreased. Therefore, the margin for the holding conditioned is narrowed.

From the foregoing description, it will be apparent that, according to the present invention, in a semiconductor memory device, the switching speed of a word line from a selected state to a nonselected state is increased so that the read-out time of a RAM is shortened and the margin for preventing write-error operation is expanded.

We claim:

1. A semiconductor memory device having word lines and having bit lines intersecting the word lines, comprising:
a memory cell array having memory cells operatively connected at the intersections of the word lines and bit lines, each of said memory cells comprising:
two PNPN cells cross-coupled with each other, each PNPN cell comprising a load transistor and a multi-emitter transistor operatively connected to said load transistor, said multi-emitter transistor comprising:
a data holding transistor; and
a read/write transistor operatively connected to said data holding transistor, said read/write transistor having a current amplification factor and having means for decreasing the current amplification factor when said read/write transistor operates inveresely.

2. A semiconductor memory device as set forth in claim 1, wherein said load transistor, said multi-emitter transistor and said read/write transistor each have an emitter, base and collector and wherein each of said PNPN cells comprises:
an N-type region as the base of said load transistor and as the collector of said multi-emitter transistor;
a P-type region having first and second portions, formed on said N-type region, as the base of said multi-emitter transistor and as the collector of said load transistor; and
first and second N+-type regions formed on said P-type region, as the emitters of said multi-emitter transistor, wherein said first N+-type region, said first portion of said P-type region under said first N+-type region, and said N-type region form said read/write transistor of said multi-emitter transistor, wherein said second portion of said P-type region forms the base of said data holding transistor, and wherein said means for decreasing the current amplification factor is included in said first portion of said P-type region under said first N+-type region, said first portion having a structure such that electrons injected into said P-type region are suppressed from reaching said first N+-type region.

3. A semiconductor memory device as set forth in claim 2, wherein said first portion of said P-type region for said read/write transistor has a concentration of impurities higher than a concentration of impurities in said second portion of said P-type region for the base of said data holding transistor.

4. A semiconductor memory device as set forth in claim 2, wherein said first portion of said P-type region for said read/write transistor has a thickness greater than the thickness of said second portion of said P-type region for the base of said data holding transistor.

5. A semiconductor memory device as set forth in claim 3 or 4, wherein said read/write transistor is an NPN transistor.

6. A semiconductor device having a semiconductor substrate, comprising:
a read/write transistor, formed in the semiconductor substrate, having a base formed by a P+-type region having a first impurity concentration;
a first holding transistor, formed in the semiconductor substrate adjacent to said read/write transistor and operatively connected to said read/write transistor, having a base formed by a P-type region having a second impurity concentration less than the first impurity concentration of said read/write transistor; and
a second holding transistor, formed in the semiconductor substrate adjacent to said first holding transistor and operatively connected to said first holding transistor, having a P-type region having the same structure as said P-type region of said first holding transistor.

7. A semiconductor device having a semiconductor substrate, comprising:
a first holding transistor, formed in the semiconductor substrate, having a first P-type region for a base;
a second holding transistor, formed in the semiconductor substrate adjacent to said first holding transistor and operatively connected to said first holding transistor, having a second P-type region having a thickness greater than the thickness of said first P-type region of said first holding transistor; and
a read/write transistor, formed between said first and second holding transistors and operatively connected to said first holding transistor, having a third P-type region having the same thickness as said second P-type region of said second holding transistor and said read/write transistor and said first holding transistor have a common base.

* * * * *

UNITED STATES PATENT AND TRADEMARK OFFICE
CERTIFICATE OF CORRECTION

PATENT NO. : 4,525,812
DATED : JUNE 25, 1985
INVENTOR(S) : KAZUHIRO TOYODA ET AL.

It is certified that error appears in the above-identified patent and that said Letters Patent is hereby corrected as shown below:

FRONT PAGE [57] ABSTRACT , Col. 2, line 1, "included" should be --including--.

Col. 1, line 8, delete "a";
      line 43, "herein" should be --hereinafter--.

Col. 3, line 28, "As" should be --At--;
      line 29, "and" should be --an--;
      line 63, "coventional" should be --conventional--.

Col. 4, line 47, "circuitt" should be --circuit--.

Col. 5, line 19, "ptential" should be --potential--;
      line 39, "$W_{1-},$" should be --$W_{1+},$--.

Col. 6, line 27, "$D_2$" should be --$D_2,$--;

line 32, "change to" should be --clamp the--.

Col. 7, line 27, "(1-65)" should be --$(1-\gamma)$--;
      line 58, after "P-type" insert --region 7--.

Signed and Sealed this

Twenty-ninth Day of October 1985

[SEAL]

Attest:

DONALD J. QUIGG

Attesting Officer

Commissioner of Patents and Trademarks—Designate